United States Patent
Katta et al.

(10) Patent No.: US 11,881,866 B2
(45) Date of Patent: Jan. 23, 2024

(54) ELECTRONIC DEVICE AND METHOD FOR CONTROLLING SLEW RATE FOR HIGH-SPEED DATA COMMUNICATIONS

(71) Applicant: SAMSUNG ELECTRONICS CO., LTD., Suwon-si (KR)

(72) Inventors: Umamaheswara Reddy Katta, Bengaluru (IN); Tamal Das, Bengaluru (IN); Vishal Khatri, Bengaluru (IN); Ankur Ghosh, Bengaluru (IN)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/879,543

(22) Filed: Aug. 2, 2022

(65) Prior Publication Data
US 2023/0283283 A1    Sep. 7, 2023

(30) Foreign Application Priority Data

Mar. 3, 2022   (IN) .............................. 202241011562

(51) Int. Cl.
*H03L 7/099* (2006.01)
*H03K 5/01* (2006.01)
*H03K 5/00* (2006.01)
*H03K 19/21* (2006.01)

(52) U.S. Cl.
CPC .............. *H03L 7/099* (2013.01); *H03K 5/01* (2013.01); *H03K 19/21* (2013.01); *H03K 2005/00078* (2013.01)

(58) Field of Classification Search
None
See application file for complete search history.

(56) References Cited

U.S. PATENT DOCUMENTS

| 7,619,448 | B2 | 11/2009 | Wu et al. | |
| 8,649,461 | B2* | 2/2014 | Shumarayev | H04L 25/14 375/295 |
| 2014/0313844 | A1* | 10/2014 | Lin | H03K 5/003 365/230.01 |
| 2016/0119169 | A1 | 4/2016 | Schober | |

FOREIGN PATENT DOCUMENTS

WO    2010/076021 A1    7/2010

* cited by examiner

*Primary Examiner* — Cassandra F Cox
(74) *Attorney, Agent, or Firm* — Sughrue Mion, PLLC

(57) ABSTRACT

An electronic device and a method of controlling a slew rate for high-speed data communications are provided. The electronic device, according to an embodiment of the disclosure, includes a serializer configured to receive parallel data from another electronic device along with clock rate information, and convert the parallel data into serial data. The electronic device further includes a delay generator configured to generate a delay in the converted serial data using the clock rate information. The electronic device further includes a multiplexer configured to multiplex the converted serial data of the non-slew mode with the delayed data of the slew mode. The electronic device further includes a plurality of driver legs configured to receive the multiplexed data, and transfer the multiplexed data to the another electronic device. The electronic device further includes at least one of a voltage-controlled oscillator and a current-controlled oscillator configured to generate the clock rate information.

15 Claims, 8 Drawing Sheets

Stacking of FETs (which limits the speed) has been eliminated

FIG. 5C

ELECTRONIC DEVICE AND METHOD FOR CONTROLLING SLEW RATE FOR HIGH-SPEED DATA COMMUNICATIONS

CROSS-REFERENCE TO RELATED APPLICATIONS

This application claims benefit of priority to Indian Patent Application No. 202241011562, filed on Mar. 3, 2022, in the Indian Patent Office, the disclosure of which is incorporated by reference herein in its entirety.

BACKGROUND

1. Field

The present disclosure relates to high-speed data communications, and more specifically, to an electronic device and a method for controlling slew rate for the high-speed data communications.

2. Description of Related Art

In general, a demand for higher data rates has exponentially increased in conventional electronic devices, such as smartphones, laptops, etc. For example, widespread use of $3^{rd}$ Generation (3G), Long-Term Evolution (LTE), and upcoming 4G technologies have significantly enhanced data rates in the electronic devices. In another example, mobile phone cameras have begun to support 5M pixels and greater as a common feature. With increased resolution and larger sizes, displays have become more complex. Indeed, several manufacturers have recently used three-dimensional (3D) display technology in mobile phones. In addition, the size and performance of solid-state memory storage have increased. These factors may raise the data rate needs of certain peripherals. To keep up with the rising data rate demand, the electronic devices may include one or more application processors, which analyze data and connect the electronic device to various services (e.g., transmit signal) that may require a high bandwidth pipe and/or a high-frequency band. A Mobile Industrial Processor Interface (MIPI) standard (e.g., D-PHY, M-PHY, etc.) is frequently used to transmit such a signal in a high-frequency spectrum between the application processors and/or the electronic devices, which specifies interfaces between components (e.g., Serial Advanced Technology Attachment (SATA), Peripheral Component Interconnect (PCI), Universal Serial Bus (USB), etc.) of the electronic devices.

The M-PHY provides asynchronous data rates in excess of 5 Gigabits per second (Gbps), allowing designers to accelerate memory transfer and Camera Serial Interface (CSI)/Display Serial Interface (DSI) interface speeds. The M-PHY is a successor to the D-PHY, featuring fewer pins and higher bandwidth per pin, as well as increased power efficiency. Data transfer in the M-PHY can be burst or continuous, and data transfers can be performed in a High Speed (HS) mode or a Low Speed (LS) mode. A Large Amplitude (LA) and a Small Amplitude (SA) driving strengths are supported by the M-PHY. Based on the signalling system utilized in the LS mode, the M-PHY supports two types of modules: Type-I and Type-II. In the LS mode, the signalling strategy might be Pulse Width Modulation (PWM) or Non-Return to Zero (NRZ). Where the PWM is used in the Type-I, and a clock is incorporated in data lanes. The data rates in the PWM mode are determined by gears that are supported. For example, a low-speed gear (e.g., G0 mode) employs a data rate as low as 10 Kilobits per second (Kbps). Furthermore, the G1 mode is a standard required gear with the data rate ranging from 3 Megabits per second (Mbps) to 9 Mbps. Each extra gear boosts the data rate by a factor of two (e.g., a G2 mode supports 6 Mbps to 18 Mbps). While the Type-I covers gears up to a G7 mode, gears up to a G5 mode are expected to be more extensively utilized in terms of power. The Type-II (e.g., system mode) is source synchronous in that a clock is needed to sample the data. The clock is common to both a transmitter and a receiver. The system mode signaling is relatively straightforward and hence easy to implement in systems not wishing to have the PWM mode.

While using the G1 mode of the M-PHY, several difficulties such as common-mode noise and electromagnetic interference (EMI) may be observed. To control the common mode noise and the EMI, a transmitter output may be slewed at certain rates (e.g., volts per nanosecond (V/ns)). However, controlling slew rates is difficult due to range and granularity limitations. For example, the G1 mode of the M-PHY has a minimum slew rate of 0.35 V/ns, a maximum slew rate of 0.9 V/ns, and an intermediate slew rate that covers a minimum and maximum limits with a granularity/resolution limit of 1 to 30%.

Certain slew rate controlling mechanisms are available for a non-serializer/deserializer application of the M-PHY whose drivers are different than a serializer/deserializer application of the M-PHY. For example, the non-serializer/deserializer application controls the slew rate via capacitors and/or feed-forward transistors in output driver circuits. Because all such implementations severely influence the drive circuits by adding additional capacitive loads, this mechanism is only relevant to the G1 mode of the M-PHY and not to other modes (e.g., G2-G5 non-slew high-speed modes). As a result, conventional non-serializer/deserializer slew control mechanisms cannot be used for the serializer/deserializer applications of the M-PHY.

Thus, it is desired to provide a useful alternative for controlling the slew rate for high-speed data communications (e.g., M-PHY).

SUMMARY

The embodiments herein provide for control of a slew rate for high-speed data communications. According to an embodiment of the present disclosure, a serializer of a first electronic device receives parallel data from a second electronic device along with clock rate information and converts the parallel data to serial data. The parallel data is received in one of a slew mode (e.g., G1, low-speed gear) and a non-slew mode (e.g., G2-G5, high-speed gear). The clock rate information is received via the Phase Lock Loop (PLL) of the first electronic device. A delay generator of the first electronic device generates a delay in the converted serial data of the slew mode using the clock rate information. The multiplexer of the first electronic device multiplexes the converted serial data of the non-slew mode with the delayed data of the slew mode at a plurality of pre-driver legs to control the slew rate. As a result, a proposed architecture of the first electronic device may meet specifications for M-PHY slew standards and/or other technologies. The aspects presented herein allow for no significant impact on non-slew output driver legs. That is, no impact on high-speed path layout (a non-slew data path) may occur, because the delay generator is only included for a slew data path.

Another embodiment presented herein provides for the first electronic device to sequentially arranging a plurality of electronic components to control the delay. The plurality of electronic components include a delayed clock, an exclusive-OR (XOR) gate, a Low Pass Filter (LPF), a comparator, and a delay control apparatus.

Another embodiment presented herein provides to configure a flexible slew rate by generating a linear delay using RC devices, where the RC devices include a plurality of resistors and a plurality of capacitors, and/or by generating a parabolic delay using a Metal Oxide Silicon (MOS) transistor.

Another embodiment presented herein provides to avoid utilizing a select line of the multiplexer, which reduces the number of Field Effect Transistors (FETs) in the plurality of pre-driver legs.

Accordingly, embodiments herein disclose a first electronic device for controlling a slew rate for high-speed data communications. The first electronic device includes a serializer configured to receive parallel data from at least one second electronic device along with clock rate information, and convert the parallel data into serial data. The parallel data is received in one of a slew mode and a non-slew mode. The clock rate information is received from a Phase Lock Loop (PLL) of the first electronic device. The first electronic device further includes a delay generator configured to generate a delay in the converted serial data using the clock rate information, where the converted serial data is in the slew mode. The first electronic device further includes a multiplexer configured to multiplex the converted serial data of the non-slew mode with the delayed data of the slew mode at a plurality of pre-driver legs of the first electronic device to control the slew rate. The first electronic device further includes a plurality of driver legs configured to receive the multiplexed data from the plurality of pre-driver legs, and transfer the multiplexed data to the at least one second electronic device. The first electronic device further includes at least one of a Voltage-Controlled Oscillator (VCO) and a Current-Controlled Oscillator (CCO) configured to generate the clock rate information, where the clock rate information includes a half-rate clock.

In an embodiment, the delay generator includes a delayed clock, an exclusive-OR (XOR) gate, a Low Pass Filter (LPF), a comparator, and a delay control apparatus, where the delayed clock, the XOR gate, the LPF, the comparator, and the delay control apparatus are arranged sequentially to control the delay.

In an embodiment, the delay generator is further configured to configure a flexible slew rate, wherein to configure the flexible slew rate, the delay generator is configured to generate a linear delay using RC devices, where the RC devices include a plurality of resistors and a plurality of capacitors, and/or generate a parabolic delay using a Metal Oxide Silicon (MOS) transistor.

In an embodiment, the multiplexer is configured to prevent use a select line of the multiplexer, and to reduce a number of Field Effect Transistors (FETs) in the plurality of pre-driver legs.

In an embodiment, the slew mode includes a low-speed gear, and the non-slew mode includes at least one high-speed gear.

In an embodiment, the delay generator is further configured to determine a minimum slew rate and a maximum slew rate using the RC devices. The delay generator is further configured to determine at least one intermediate slew rate based on the minimum slew rate and the maximum slew rate using a delay control apparatus of the delay generator. The delay generator is further configured to store the minimum slew rate, the maximum slew rate, and the at least one intermediate slew rate. The delay generator is further configured to receive data from the serializer, where the received data is in the slew mode. The delay generator is further configured to generate the delay on the received data using the stored minimum slew rate, the stored maximum slew rate, and the stored at least one intermediate slew rate.

In an embodiment, the delay generator is further configured to receive the half-rate clock from the PLL. The delay generator is further configured to apply the half-rate clock to the RC devices to generate a delayed half-rate clock. The delay generator is further configured to extract a difference between the received half-rate clock and the delayed half-rate clock. The delay generator is further configured to determine whether the difference is within a threshold range of the slew mode. The threshold range includes the minimum slew rate and the maximum slew rate. The delay generator is further configured to perform one of: adjust the difference using a feedback mechanism in response to determining that the difference is not within threshold range of the slew mode and storing the minimum slew rate and the maximum slew rate, or store the minimum slew rate and the maximum slew rate in response to determining that the difference is within threshold range of the slew mode.

Accordingly, embodiments herein disclose a method for controlling the slew rate for high-speed data communications. The method includes receiving, by the serializer of the first electronic device, parallel data from at least one second electronic device along with clock rate information. The serializer converting the parallel data into serial data. The parallel data being received in one of a slew mode and a non-slew mode. The clock rate information being received from the PLL of the first electronic device. The method further includes generating, by a delay generator of the first electronic device, a delay in the converted serial data using the clock rate information, where the converted serial data is in the slew mode. The method further includes multiplexing, by a multiplexer of the first electronic device, the converted serial data of the non-slew mode with the delayed data of the slew mode at a plurality of pre-driver legs of the first electronic device to control the slew rate.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein, and the embodiments herein include all such modifications.

BRIEF DESCRIPTION OF THE DRAWINGS

This invention is illustrated in the accompanying drawings, throughout which like reference letters indicate corresponding parts in the various figures. The embodiments herein will be better understood from the following description with reference to the drawings, in which.

DETAILED DESCRIPTION OF THE INVENTION

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. Also, the various embodiments described herein are not necessarily mutually exclusive, as some embodiments can be combined with one or more other embodiments to form new embodiments. The term "or" as used herein, refers to a non-exclusive or, unless otherwise indicated. The examples used herein are intended merely to facilitate an understanding of ways in which the embodiments herein can be practiced and to further enable those skilled in the art to practice the embodiments herein. Accordingly, the examples should not be construed as limiting the scope of the embodiments herein.

As is traditional in the field, embodiments may be described and illustrated in terms of blocks which carry out a described function or functions. These blocks, which may be referred to herein as units or modules or the like, are physically implemented by analog or digital circuits such as logic gates, integrated circuits, microprocessors, microcontrollers, memory circuits, passive electronic components, active electronic components, optical components, hardwired circuits, or the like, and may optionally be driven by firmware. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the invention. Likewise, the blocks of the embodiments may be physically combined into more complex blocks without departing from the scope of the invention The accompanying drawings are used to help easily understand various technical features and it should be understood that the embodiments presented herein are not limited by the accompanying drawings. As such, the present disclosure should be construed to extend to any alterations, equivalents and substitutes in addition to those which are particularly set out in the accompanying drawings. Although the terms first, second, etc. may be used herein to describe various elements, these elements should not be limited by these terms. These terms are generally only used to distinguish one element from another.

Throughout this disclosure, the terms "mux" and "multiplexer" are used interchangeably and means the same. The terms "mux data" and "multiplexed data" are used interchangeably and means the same.

Accordingly, embodiments herein disclose a first electronic device for controlling a slew rate for high-speed data communications. The first electronic device includes a serializer for receiving parallel data from a second electronic device (e.g., a digital circuit) along with a clock rate information and converting the parallel data into serial data, where the parallel data is received in one of a slew mode and a non-slew mode, and the clock rate information is received from a Phase Lock Loop (PLL) of the first electronic device. Further, the first electronic device includes a delay generator for generating a delay in the converted serial data using the clock rate information, where the converted serial data is in the slew mode. Further, the first electronic device includes a mux for multiplexing the converted serial data of the non-slew mode with the delayed data of the slew mode at a plurality of pre-driver legs of the first electronic device to control the slew rate. Further, the first electronic device includes a plurality of driver legs for receiving the mux data from the plurality of pre-driver legs and transferring to the second electronic device. Further, the first electronic device includes a voltage-controlled oscillator (VCO) and/or a current-controlled oscillator (CCO) for generating the clock rate information, where the clock rate information includes a half-rate clock.

Accordingly, embodiments herein disclose a method for controlling the slew rate for high-speed data communications. The method includes receiving, by the serializer of the first electronic device, parallel data from the second electronic device along with the clock rate information, where the serializer converts the parallel data into serial data and the parallel data is received in one of a slew mode and a non-slew mode and the clock rate information is received from the PLL of the first electronic device. Further, the method includes generating, by the delay generator of the first electronic device, the delay in the converted serial data using the clock rate information, where the converted serial data is in the slew mode. Further, the method includes multiplexing, by the mux of the first electronic device, the converted serial data of the non-slew mode with the delayed data of the slew mode at the plurality of pre-driver legs of the first electronic device to control the slew rate.

Unlike conventional methods and systems, the proposed method allows the first electronic device to control a slew rate for high-speed data communications. The serializer of the first electronic device receives parallel data from the second electronic device along with clock rate information and converts the parallel data to serial data. The receiving parallel data is received in one of a slew mode (e.g., G1, low-speed gear) and a non-slew mode (e.g., G2-G5, high-speed gear), and the clock rate information is received via the PLL of the first electronic device. Then, using the clock rate information, the delay generator of the first electronic device generates the delay in the converted serial data of the slew mode. The mux of the first electronic device then multiplexes the converted serial data of the non-slew mode with the delayed data of the slew mode at the plurality of pre-driver legs to control the slew rate. As a result, a proposed architecture of the first electronic device may meet specifications for M-PHY slew standards and/or other technologies. The aspects presented herein allow for no significant impact on non-slew output driver legs. That is, no impact on high-speed path layout (a non-slew data path) may occur, because the delay generator is only included for a slew data path.

Unlike conventional methods and systems, the proposed method allows the first electronic device to sequentially arrange a plurality of electronic components to control the delay. The plurality of electronic components include a delayed clock, an exclusive-OR (XOR) gate, a Low Pass Filter (LPF), a comparator, and a delay control apparatus.

Unlike conventional methods and systems, the proposed method allows the first electronic device to configure a flexible slew rate by generating a linear delay using RC devices, where the RC devices include a plurality of resistors and a plurality of capacitors, and/or by generating a parabolic delay using a Metal Oxide Silicon (MOS) transistor.

Unlike conventional methods and systems, the proposed method allows the first electronic device to avoid utilizing a select line of the mux, which reduces the number of Field Effect Transistors (FETs) in the plurality of pre-driver legs.

Referring now to the drawings, and more particularly to FIGS. 1 through 5C, where similar reference characters denote corresponding features consistently throughout the figures, there are shown preferred embodiments.

Figure 1:
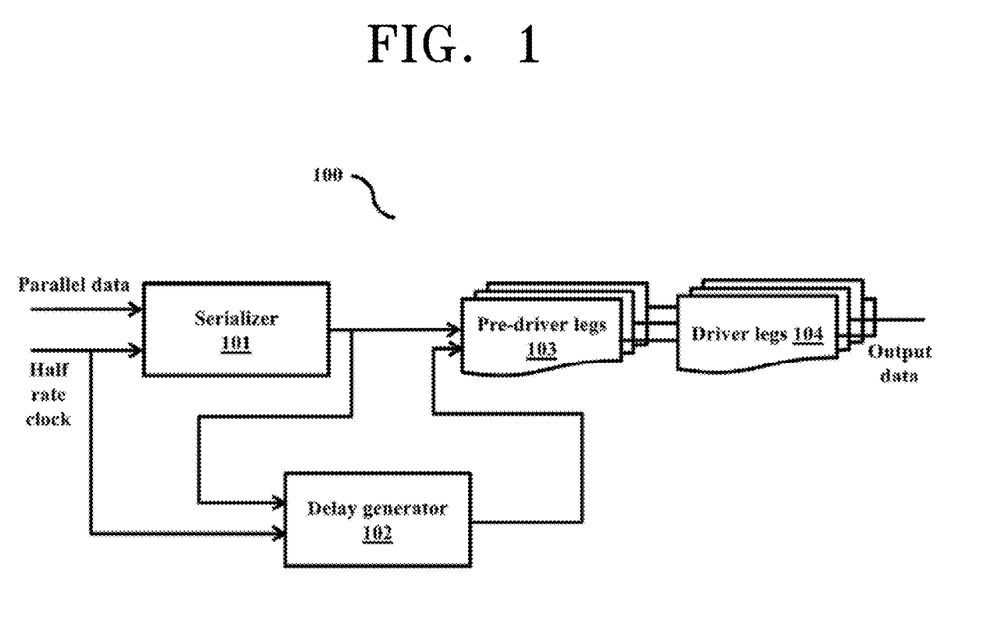
FIG. 1 illustrates a block diagram of a first electronic device for controlling a slew rate for high-speed data communications, according to an embodiment as disclosed herein.

FIG. 1 illustrates a block diagram of a first electronic device (100) for controlling a slew rate for high-speed data communications, according to an embodiment as disclosed herein. Examples of the first electronic device (100) include, but are not limited to, a communication interface (e.g., Serial Advanced Technology Attachment (SATA), a Peripheral Component Interconnect (PCI), a Universal Serial Bus (USB), etc.).

The first electronic device (100) is implemented by processing circuitry such as logic gates, integrated circuits, microprocessors, microcontrollers, memory circuits, passive electronic components, active electronic components, optical components, hardwired circuits, or the like, and may optionally be driven by firmware. The circuits may, for example, be embodied in one or more semiconductor chips, or on substrate supports such as printed circuit boards and the like.

In an embodiment, the first electronic device (100) includes a serializer (101), a delay generator (102), a plurality of pre-driver legs (103), and a plurality of driver legs (104).

The serializer (101) receives parallel data from a second electronic device (e.g., a digital circuit) (not shown in FIG. 1) along with a clock rate information and converts the parallel data into serial data, where the parallel data is received in a slew mode or a non-slew mode and the clock rate information is received from a PLL (not shown in FIG. 1) of the first electronic device (100). The slew mode includes a low-speed gear (e.g., G1) and the non-slew mode includes a high-speed gear (e.g., G2, G3, G4, G5, etc.). A VCO or a CCO of the PLL generates the clock rate information, where the clock rate information includes a half-rate clock.

The delay generator (102) generates a delay in the received parallel data using the clock rate information, where the converted serial data is in the slew mode. The delay generator (102) includes a delayed clock, an XOR gate, a LPF, a comparator, and a delay control apparatus are arranged sequentially to control the delay. The delay control apparatus configures a flexible slew rate by generating a linear delay using RC devices, where the RC devices include a plurality of resistors and a plurality of capacitors and/or by generating a parabolic delay using a MOS transistor.

Alternatively or additionally, the delay generator (102) receives the half-rate clock from the PLL. The delay generator (102) applies the half-rate clock to the RC devices to generate a delayed half-rate clock. The delay generator (102) extracts a difference between the received half-rate clock and the delayed half-rate clock. The delay generator (102) determines whether the difference is within a threshold range of the slew mode (e.g., a minimum slew rate of 0.35 V/ns, a maximum slew rate of 0.9 V/ns), where the threshold range includes the minimum slew rate and the maximum slew rate. The delay generator (102) increases or decreases (e.g., adjusts) the difference using a feedback mechanism in response to determining that the difference is not within the threshold range of the slew mode and stores the minimum slew rate and the maximum slew rate. The delay generator (102) stores the minimum slew rate and the maximum slew rate in response to determining that the difference is within the threshold range of the slew mode.

Alternatively or additionally, the delay generator (102) determines one or more intermediate slew rates based on the minimum slew rate and the maximum slew rate using the delay control apparatus. The delay generator (102) stores the minimum slew rate, the maximum slew rate, and the one or more intermediate slew rates. The delay generator (102) receives data from the serializer (101), where the received data is in the slew mode. The delay generator (102) generates the delay on the received data using the stored minimum slew rate, the maximum slew rate, and the one or more intermediate slew rates to minimize a common-mode noise and an electromagnetic interference (EMI).

Then, a mux (not shown in FIG. 1) multiplexes the converted serial data of the non-slew mode with the delayed data of the slew mode at the plurality of pre-driver legs (103) of the first electronic device (100) to control the slew rate. The plurality of driver legs (104) receives the mux data from the plurality of pre-driver legs (103) and transfers to the second electronic device.

Although FIG. 1 shows various hardware components of the first electronic device (100), it is to be understood that other embodiments are not limited thereon. In other embodiments, the first electronic device (100) may include less or more components. Further, the labels and/or names of the components are used only for illustrative purposes and do not limit the scope of the invention. For example, one or more components can be combined together to perform same or substantially similar functionality to control the slew rate for the high-speed data communications.

Figure 2:
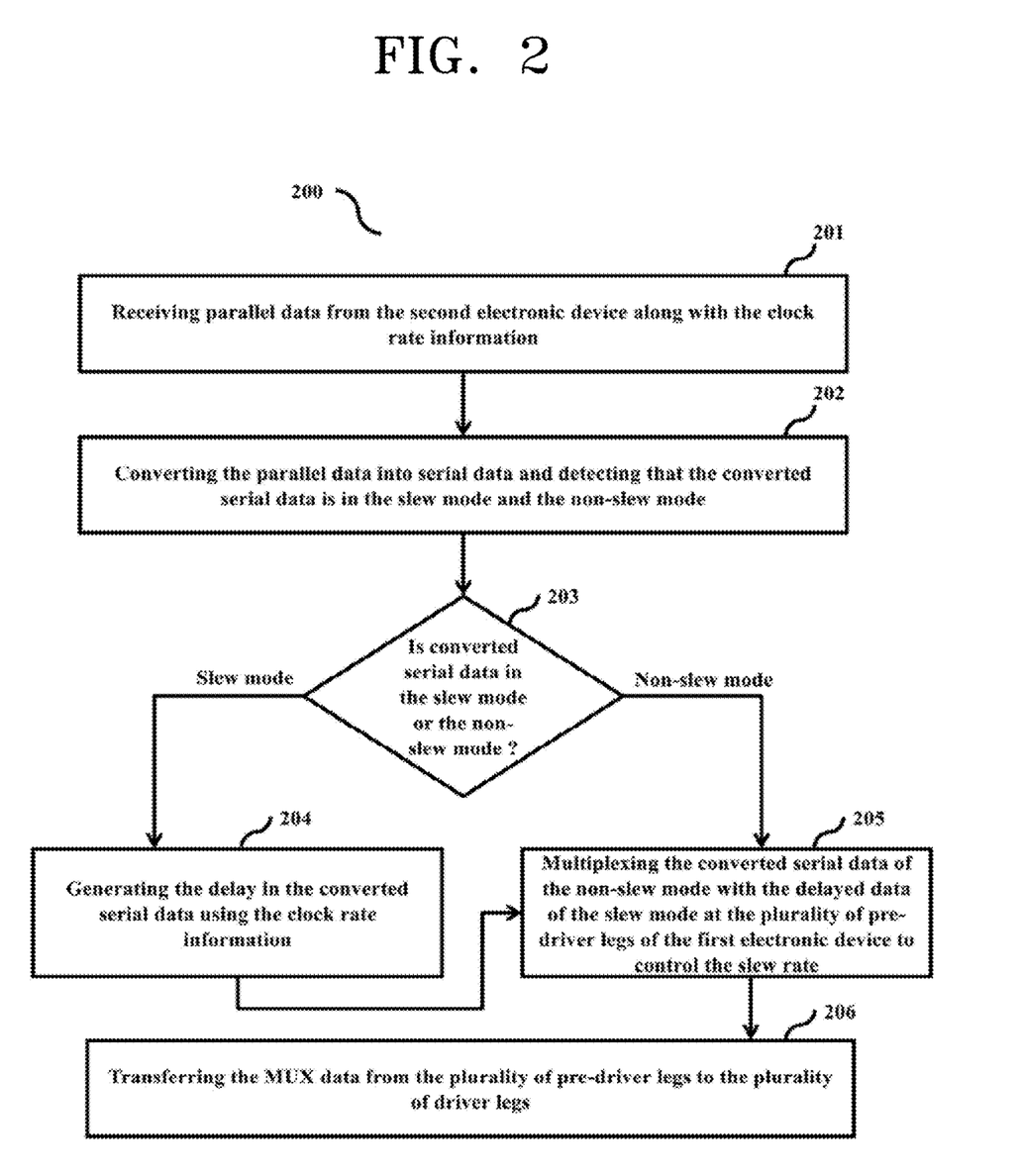
FIG. 2 is a flow diagram illustrating a method for controlling the slew rate for the high-speed data communications, according to an embodiment as disclosed herein.

FIG. 2 is a flow diagram (200) illustrating a method for controlling the slew rate for the high-speed data communications, according to an embodiment as disclosed herein. The first electronic device (100) performs steps (201-206) of the flow diagram (200) to control the slew rate for the high-speed data communications.

At step (201), the method includes receiving the parallel data from the second electronic device along with the clock rate information. At step (202), the method includes converting the parallel data into serial data and detecting that the converted serial data is in the slew mode or the non-slew mode. At step (203), the method includes determining whether the converted serial data is in the slew mode or the non-slew mode. At step (204), the method includes generating the delay in the converted serial data using the clock rate information in response to determining that the converted serial data is in the slew mode. At step (205), the method includes multiplexing the converted serial data of the non-slew mode with the delayed data of the slew mode at the plurality of pre-driver legs (103) of the first electronic device (100) to control the slew rate in response to determining that the converted serial data is in the non-slew mode. At step (206), the method includes transferring the mux data from the plurality of pre-driver legs (103) to the plurality of driver legs (104).

Figure 3A:
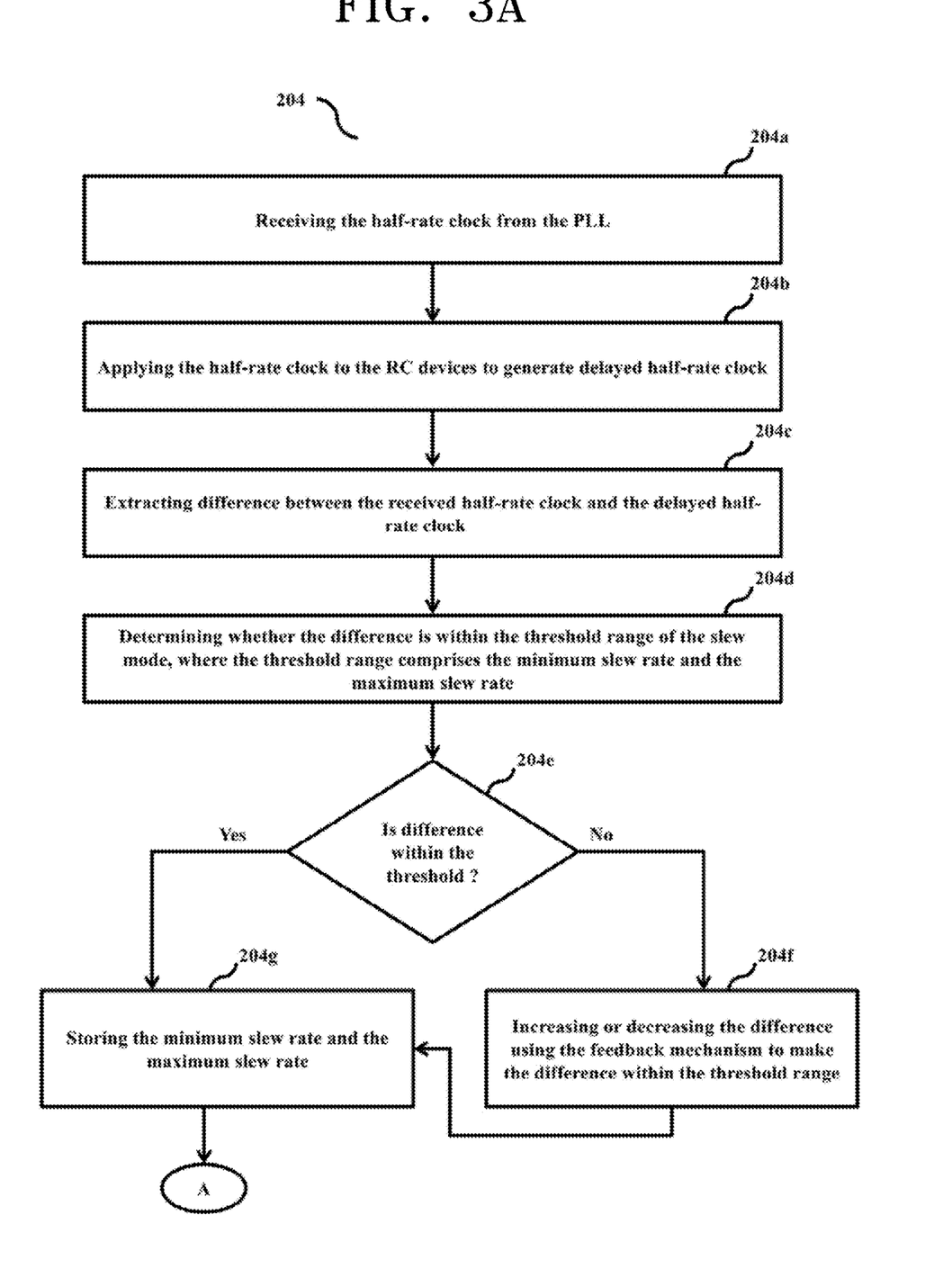
FIGS. 3A-3B are a flow diagram illustrating a method for generating a delay in converted serial data using clock rate information, according to an embodiment as disclosed herein.
Figure 3B:
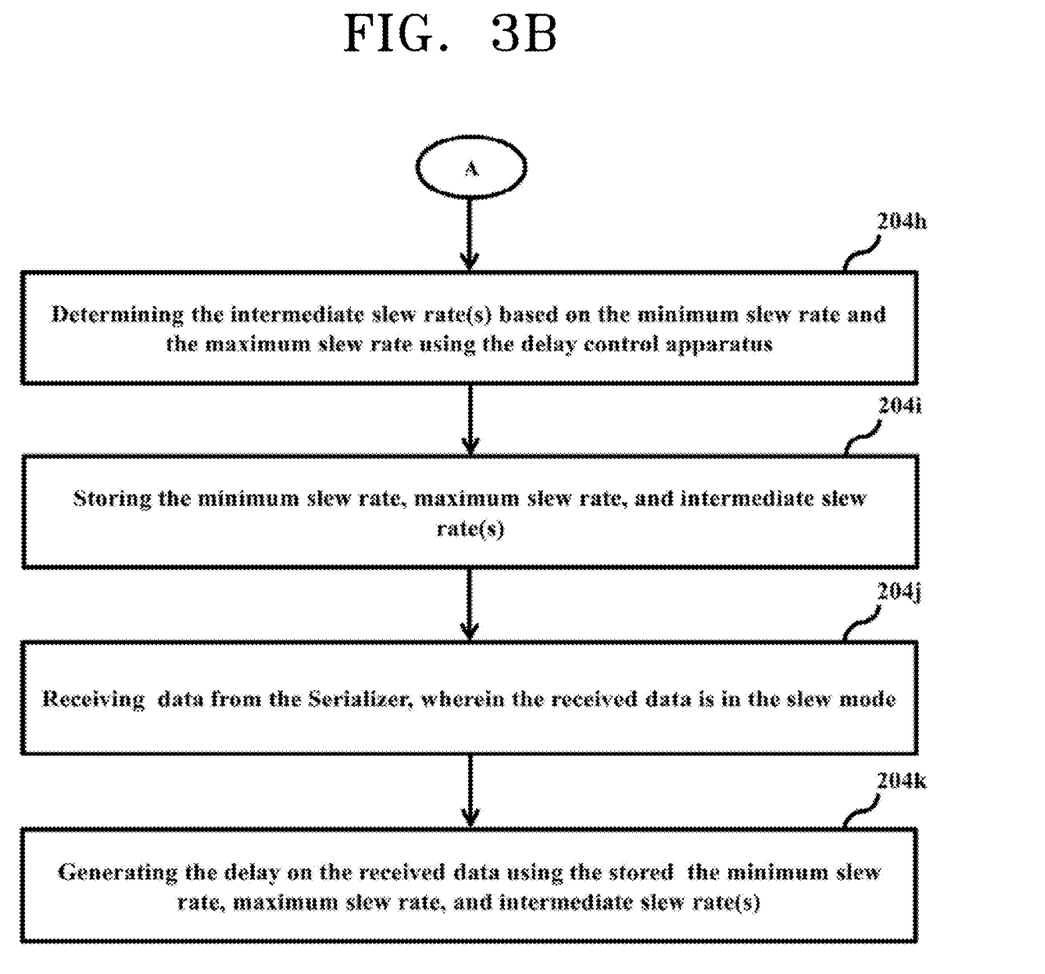

FIGS. 3A and 3B are a flow diagram (204) illustrating a method for generating the delay in converted serial data using clock rate information, according to an embodiment as disclosed herein. The first electronic device (100) performs steps (204a-204k) of the flow diagram (204) to generate the delay in the converted serial data using the clock rate information, as described in reference to step (204) of FIG. 2.

Referring to FIG. 3A, at step (204a), the method includes receiving the half-rate clock from the PLL. At step (204b), the method includes applying the half-rate clock to the RC devices to generate the delayed half-rate clock. At step (204c), the method includes extracting the difference between the received half-rate clock and the delayed half-rate clock. At steps (204d) and (204e), the method includes determining whether the difference is within the threshold range of the slew mode, where the threshold range includes the minimum slew rate and the maximum slew rate. At step (204f), the method includes increasing or decreasing (e.g., adjusting) the difference using the feedback mechanism to make the difference within the threshold range in response to determining that the difference is not within the threshold range of the slew mode, and the method further flows to step (204g).

Referring to FIG. 3B, at step (204g), the method includes storing the minimum slew rate and the maximum slew rate in response to determining that the difference is within the threshold range of the slew mode.

At step (204h), the method includes determining the one or more intermediate slew rates based on the minimum slew rate and the maximum slew rate using the delay control apparatus. At step (204i), the method includes storing the minimum slew rate, the maximum slew rate, and the one or more intermediate slew rates. At step (204j), the method includes receiving data from the serializer (101), where the received data is in the slew mode. At step (204k), the method includes generating the delay on the received data using the stored minimum slew rate, the stored maximum slew rate, and the stored one or more intermediate slew rates.

The various actions, acts, blocks, steps, or the like in the flow diagrams (200 and 204) may be performed in the order presented, in a different order and/or simultaneously. Further, in some embodiments, some of the actions, acts, blocks, steps, or the like may be omitted, added, modified, skipped, or the like without departing from the scope of the invention.

Figure 4A:
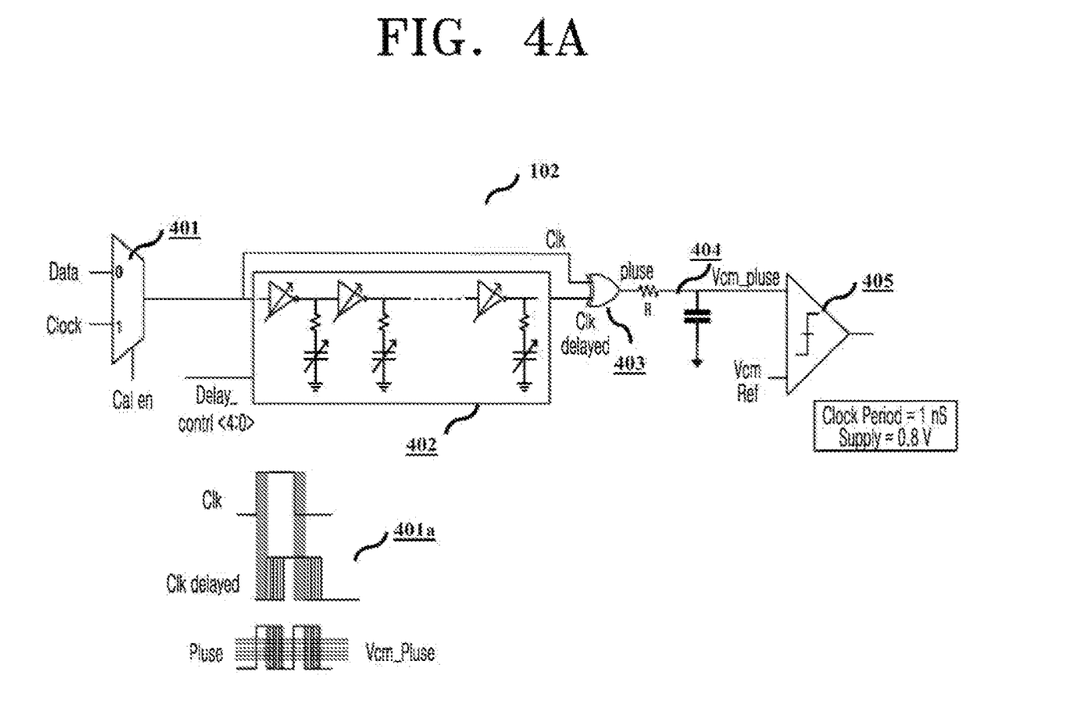
FIGS. 4A-4B illustrate an example circuit diagram of a delay generator for controlling the slew rate for the high-speed data communications and an example of output waveform having a slew generated by the first electronic device, according to an embodiment as disclosed herein.
Figure 4B:
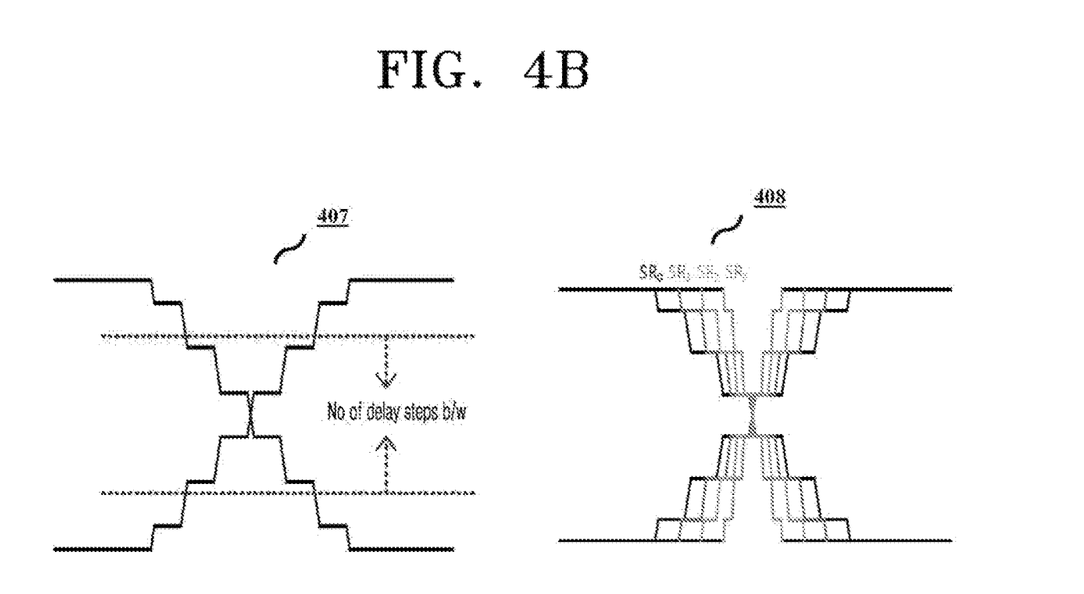

FIGS. 4A-4B illustrate an example circuit diagram of the delay generator (102) for controlling the slew rate for the high-speed data communications and an example of output waveform having the slew generated by the first electronic device (100), according to an embodiment as disclosed herein. The delay generator (102) includes the delayed clock (401a), the XOR gate (403), the LPF (404), the comparator (405), and the delay control apparatus (402), which are arranged sequentially to control the delay.

Referring to FIG. 4A, the delay control apparatus (402) configures the flexible slew rate by generating the linear delay using RC devices, where the RC devices include the plurality of resistors and the plurality of capacitors and/or generating the parabolic delay using the MOS transistor.

For example, the delay control apparatus (402) receives the half-rate clock from the PLL, where the clock information is enabled using a select line (e.g., cal en) of the multiplexer (401) (e.g., a mux). The delay control apparatus (402) applies the half-rate clock to the RC devices to generate the delayed half-rate clock, extracts the difference between the received half-rate clock and the delayed half-rate clock, and determines whether the difference is within the threshold range of the slew mode, where the threshold range includes the minimum slew rate and the maximum slew rate. The delay control apparatus (402) increases or decreases (e.g., adjusts) the difference using the feedback mechanism in response to determining that the difference is not within the threshold range of the slew mode and stores the minimum slew rate and the maximum slew rate in response to determining that the difference is within the threshold range of the slew mode. The delay control apparatus (402) then determines the one or more intermediate slew rates based on the minimum slew rate and the maximum slew rate and stores the same.

In some embodiments, the delay control apparatus (402) stores the slew-required information (e.g., the minimum slew rate, the maximum slew rate, and the one or more intermediate slew rates). The delay control apparatus (402) receives the slew data from the serializer (101), where the slew data is enabled using the select line (e.g., cal en) of the multiplexer (401). The delay control apparatus (402) generates the delay on the received data using the stored minimum slew rate, the stored maximum slew rate, and the stored one or more intermediate slew rates. The XOR gate (403) generates an output of logical 1 only when either of the two inputs is logical 1. Thus, the delay of delay generator block is converted into an XOR output duty cycle. The LPF (404) generates an average of the input signal. Thus, the delay is converted into LPF output voltage. The comparator (405) compares the voltage with reference voltages to calibrate minimum, maximum, and intermediate codes.

Referring to FIG. 4B, the example of output waveform (407) having the slew generated by the first electronic device (100). Here, driver legs get same data input but with delay among them as per slew requirement. Thus, the output of driver is a stair-cased waveform which is nothing but the required slewed output. The slewed output for different codes (e.g., minimum, maximum, intermediate) is shown in superimposed form in (408).

Figure 5A:
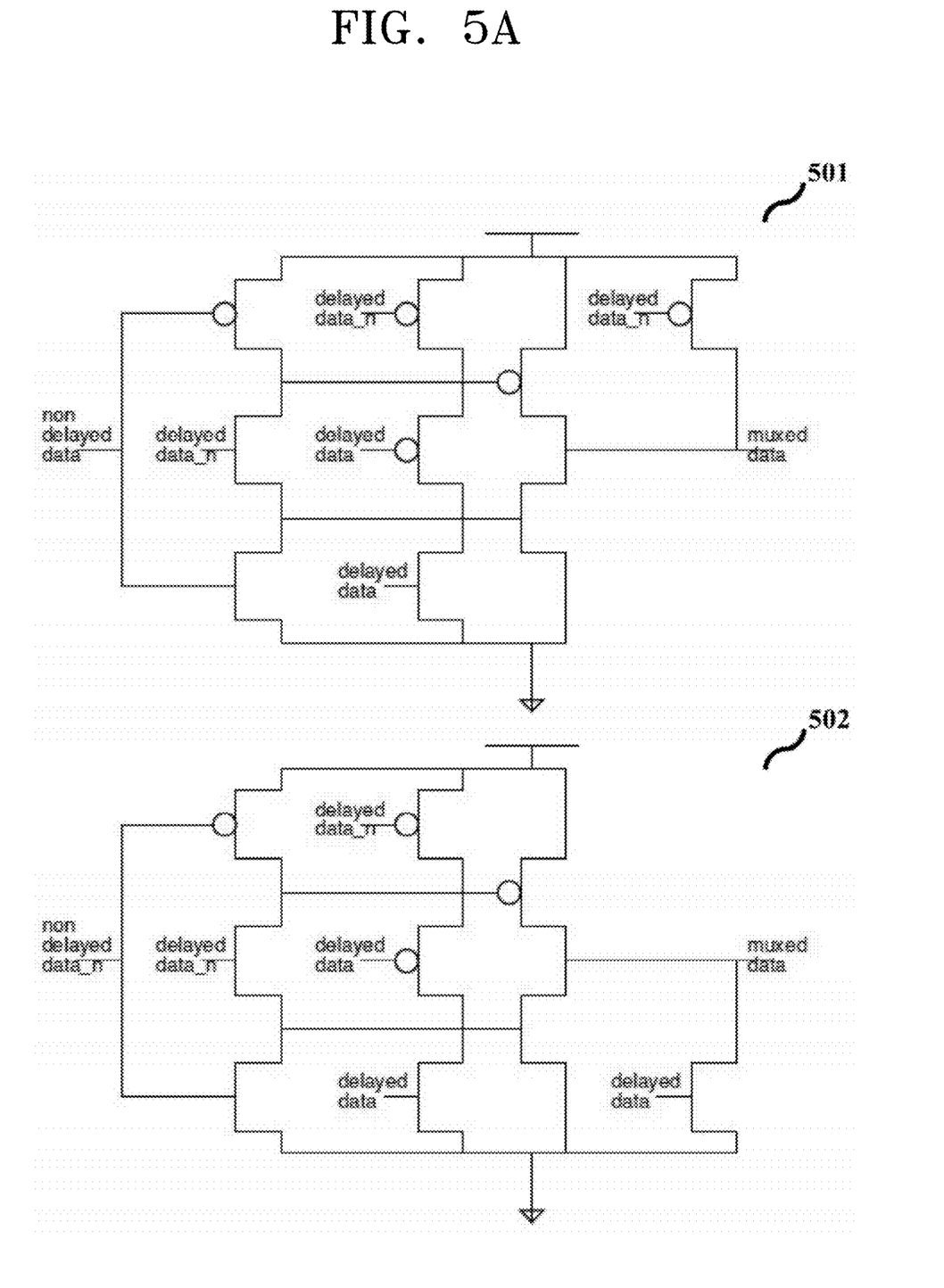
FIGS. 5A-5C illustrate example circuit diagrams of a pre-driver leg in a non-slew mode and a slew mode, according to an embodiment as disclosed herein.
Figure 5B:
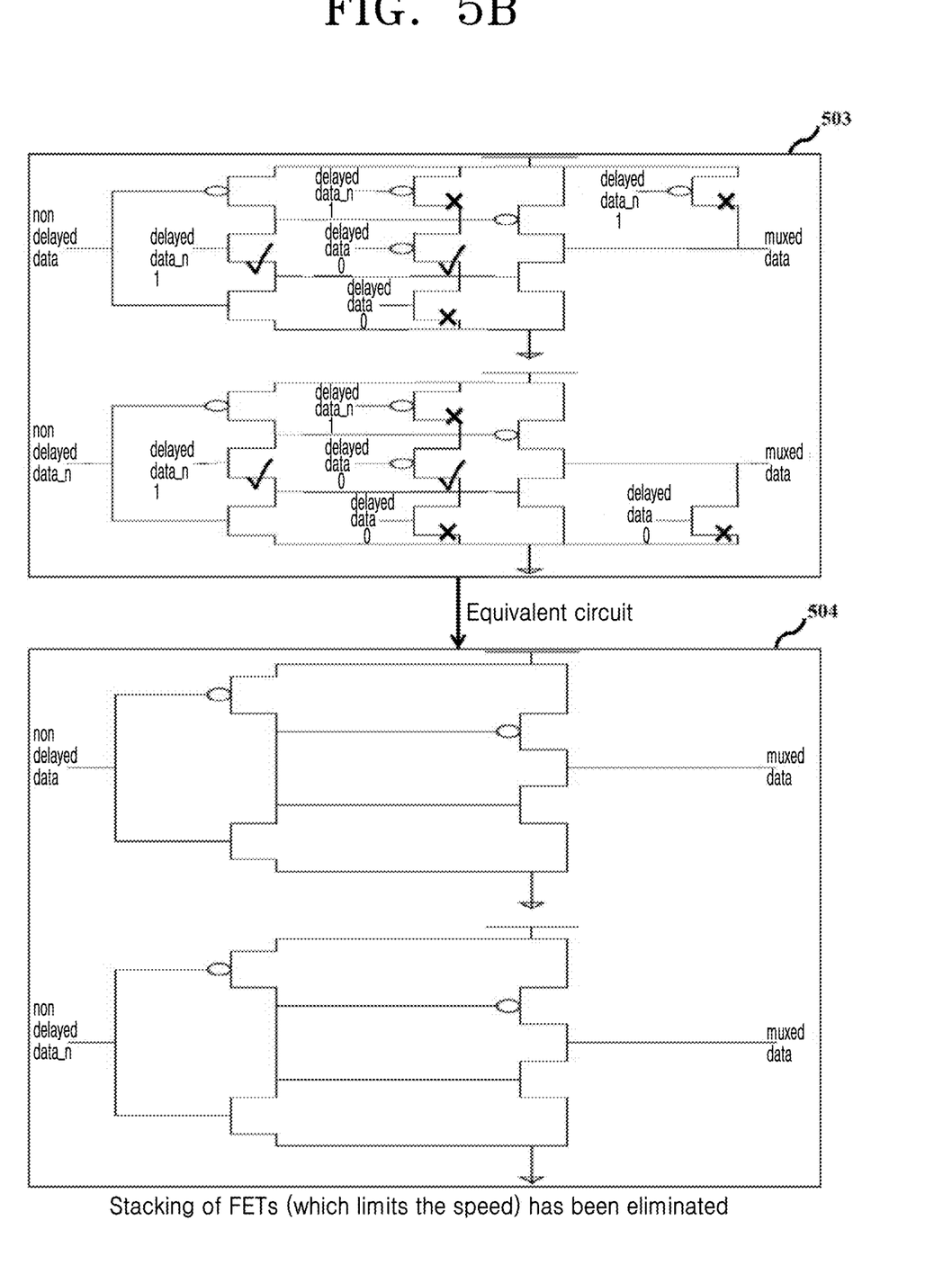
Figure 5C:
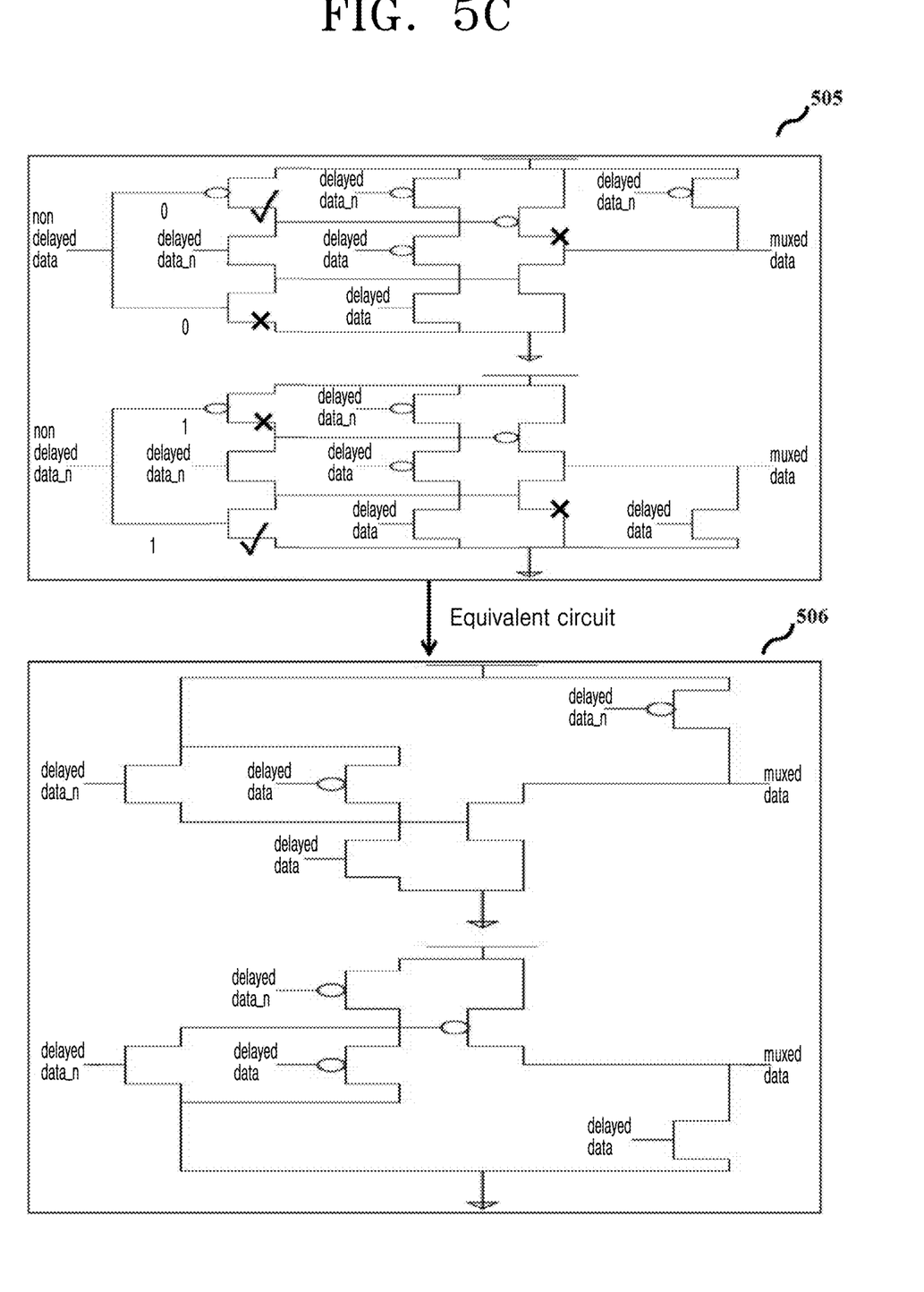

FIGS. 5A-5C illustrate example circuit diagrams of a pre-driver leg in a non-slew mode and a slew mode, according to an embodiment as disclosed herein.

Referring to FIG. 5A, a first example circuit (501) and a second example circuit (502) of the plurality of pre-driver legs (103) is shown. As described above with reference to FIG. 1, the first and second example circuits (501 and 502) may be multiplexers that multiplex the converted serial data of the non-slew mode with the delayed data of the slew mode at the plurality of pre-driver legs (103) of the first electronic device (100) to control the slew rate. In general, three inputs are received by the mux ('101) a multiplexer (e.g., A, B, S). Where "A" and "B" represent input lines and "S" represents the select line. When the value of the select line is zero, the output of the multiplexer is "A". When the value of the select line is one, the output of the multiplexer is "B". The first and second example circuits (501 and 502) of the first electronic device (100) use a two-input multiplexer architecture or, in other words, multiplexing does not use the select line of the multiplexer which reduces the number of FETs/MOSFETs in the plurality of pre-driver legs (103) to avoid stacking/jitter in the first electronic device (100). Thus, when the value of the input line (e.g., B) is zero, then the output of the multiplexer is "A", and when the value of the input line (e.g., A) is zero, then the output of the multiplexer is "B".

Referring to FIGS. 5B and 5C, the equivalent circuits of the example circuits (503) and (505) are given in equivalent example circuits (504) and (506) for non-slewed mode and slewed modes, respectively. The equivalent circuits (504) and (506) are arrived at by applying the conditions given in reference to the previous section (i.e., along with basic CMOS logic, for input at gate=0/1, PMOS is ON/OFF & NMOS is OFF/ON). The equivalent circuit (504) is essentially two back-to-back inverters, which is good in terms of jitter for G2-G5 modes, for example. While the equivalent circuit (506) may introduce jitter as the pull-up & pull-down paths are asymmetric. However, the impact of the jitter may be minimal in low speed modes (e.g., G1).

The embodiments disclosed herein can be implemented using at least one hardware device and performing network management functions to control the elements.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the scope of the embodiments as described herein.

What is claimed is:

1. A first electronic device for controlling a slew rate for high-speed data communications, the first electronic device comprising:
    a serializer configured to receive parallel data from at least one second electronic device along with clock rate information, and convert the parallel data into serial data, wherein the parallel data is received in one of a slew mode and a non-slew mode, and wherein the clock rate information is received from a phase lock loop (PLL) of the first electronic device;
    a delay generator configured to generate a delay in the converted serial data using the clock rate information, wherein the converted serial data is in the slew mode;
    a plurality of pre-driver legs configured to multiplex the converted serial data of the non-slew mode with the delayed data of the slew mode to control the slew rate;
    a plurality of driver legs configured to receive the multiplexed data from the plurality of pre-driver legs, and transfer the multiplexed data to the at least one second electronic device; and
    at least one of a voltage-controlled oscillator (VCO) and a current-controlled oscillator (CCO) configured to generate the clock rate information, wherein the clock rate information comprises a half-rate clock.

2. The first electronic device of claim 1, wherein the delay generator comprises a delayed clock, an exclusive-OR (XOR) gate, a low-pass filter (LPF), a comparator, and a delay control apparatus, wherein the delayed clock, the XOR gate, the LPF, the comparator, and the delay control apparatus are arranged sequentially to control the delay in the converted serial data.

3. The first electronic device of claim 1, wherein the delay generator is further configured to configure a flexible slew rate, wherein to configure the flexible slew rate, the delay generator is configured to:
    generate a linear delay using RC devices, wherein the RC devices comprises a plurality of resistors and a plurality of capacitors; and
    generate a parabolic delay using at least one metal oxide silicon (MOS) transistor.

4. The first electronic device of claim 1, wherein to multiplex the converted serial data, the plurality of pre-driver legs is configured to prevent use of a select line, and reduce a number of field effect transistors (FETs) in the plurality of pre-driver legs.

5. The first electronic device of claim 1, wherein the slew mode comprises a low-speed gear, and the non-slew mode comprises at least one high-speed gear.

6. The first electronic device of claim 1, wherein to generate the delay in the converted serial data using the clock rate information, the delay generator is further configured to:
    determine a minimum slew rate and a maximum slew rate using RC devices;
    determine at least one intermediate slew rate based on the minimum slew rate and the maximum slew rate using a delay control apparatus of the delay generator;
    store the minimum slew rate, the maximum slew rate, and the at least one intermediate slew rate;
    receive data from the serializer, wherein the received data is in the slew mode; and
    generate the delay on the received data using the stored the minimum slew rate, the stored maximum slew rate, and the stored at least one intermediate slew rate.

7. The first electronic device of claim 6, wherein to determine the minimum slew rate and the maximum slew rate using the RC devices, the delay generator is further configured to:
    receive the half-rate clock from the PLL;
    apply the half-rate clock to the RC devices to generate a delayed half-rate clock;
    extract a difference between the received half-rate clock and the delayed half-rate clock;
    determine whether the difference is within a threshold range of the slew mode, wherein the threshold range comprises the minimum slew rate and the maximum slew rate; and
    perform one of:
        adjust the difference using a feedback mechanism in response to determining that the difference is not within the threshold range of the slew mode and storing the minimum slew rate and the maximum slew rate, or
        store the minimum slew rate and the maximum slew rate in response to determining that the difference is within the threshold range of the slew mode.

8. A method for controlling a slew rate for high-speed data communications, the method comprising:
    receiving, by a serializer of a first electronic device, parallel data from at least one second electronic device along with clock rate information, wherein the serializer converts the parallel data into serial data, wherein the parallel data is received in one of a slew mode and a non-slew mode, and wherein the serializer receives the clock rate information from a phase lock loop (PLL) of the first electronic device;
    generating, by a delay generator of the first electronic device, a delay in the converted serial data using the clock rate information, wherein the converted serial data is in the slew mode; and multiplexing, by a plurality of pre-driver legs of the first electronic device, the converted serial data of the non-slew mode with the delayed data of the slew mode to control the slew rate.

9. The method of claim 8, wherein the generating of the delay comprises controlling the delay with a delayed clock, an exclusive-OR (XOR) gate, a low-pass filter (LPF), a comparator, and a delay control apparatus of the delay generator, wherein the delayed clock, the XOR gate, the LPF, the comparator, and the delay control apparatus are arranged sequentially.

10. The method of claim 8, further comprising configuring, by the delay generator, a flexible slew rate, the configuring of the flexible slew rate comprising:

generating a linear delay using RC devices, wherein the RC devices comprises a plurality of resistors and a plurality of capacitors; and generating a parabolic delay using at least one metal oxide silicon (MOS) transistor.

11. The method of claim 8, wherein the multiplexing of the converted serial data of the non-slew mode with the delayed data of the slew mode comprises preventing use of a select line, and reducing a number of field effect transistors (FETs) in the plurality of pre-driver legs.

12. The method of claim 8, wherein the clock rate information comprises a half-rate clock generated by at least one of a voltage-controlled oscillator (VCO) and a current-controlled oscillator (CCO) of the PLL.

13. The method of claim 8, wherein the slew mode comprises a low-speed gear and the non-slew mode comprises at least one high-speed gear.

14. The method of claim 8, wherein the generating of the delay in the converted serial data comprises:

determining, by the delay generator, a minimum slew rate and a maximum slew rate using RC devices;

determining, by the delay generator, at least one intermediate slew rate based on the minimum slew rate and the maximum slew rate using a delay control apparatus of the delay generator;

storing, by the delay generator, the minimum slew rate, the maximum slew rate, and the at least one intermediate slew rate;

receiving, by the delay generator, data from the serializer, wherein the received data is in the slew mode; and generating, by the delay generator, the delay on the received data using the stored minimum slew rate, the stored maximum slew rate, and the stored at least one intermediate slew rate.

15. The method of claim 14, wherein the determining of the minimum slew rate and the maximum slew rate using the RC devices comprises:

receiving, by the delay generator, a half-rate clock from the PLL;

applying, by the delay generator, the half-rate clock to the RC devices to generate a delayed half-rate clock;

extracting, by the delay generator, a difference between the received half-rate clock and the delayed half-rate clock;

determining, by the delay generator, whether the difference is within a threshold range of the slew mode, wherein the threshold range comprises the minimum slew rate and the maximum slew rate; and performing, by the delay generator, one of:

adjusting the difference using a feedback mechanism in response to determining that the difference is not within the threshold range of the slew mode and storing the minimum slew rate and the maximum slew rate, or storing the minimum slew rate and the maximum slew rate in response to determining that the difference is within the threshold range of the slew mode.

* * * * *